(12) United States Patent
Carroll et al.

(10) Patent No.: US 8,262,944 B2
(45) Date of Patent: Sep. 11, 2012

(54) GLASS COMPOSITIONS USED IN CONDUCTORS FOR PHOTOVOLTAIC CELLS

(75) Inventors: Alan Frederick Carroll, Raleigh, NC (US); Kenneth Warren Hang, Hillsborough, NC (US); Brian J. Laughlin, Apex, NC (US); Zhigang Rick Li, Hockessin, DE (US); Hisashi Matsuno, Tokyo (JP); Yueli Wang, Cary, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 164 days.

(21) Appl. No.: 12/819,316

(22) Filed: Jun. 21, 2010

(65) Prior Publication Data

US 2011/0147677 A1 Jun. 23, 2011

Related U.S. Application Data

(60) Provisional application No. 61/224,507, filed on Jul. 10, 2009, provisional application No. 61/218,557, filed on Jun. 19, 2009.

(51) Int. Cl.
*H01B 1/22* (2006.01)
*B05D 5/12* (2006.01)
*H01L 31/0224* (2006.01)

(52) U.S. Cl. ............ 252/514; 136/252; 427/74
(58) Field of Classification Search .......... 252/512–514; 136/252–256; 427/74
See application file for complete search history.

(56) References Cited

U.S. PATENT DOCUMENTS

| | | | |
|---|---|---|---|
| 6,355,586 B1 * | 3/2002 | Usui et al. | 501/45 |
| 7,030,048 B2 * | 4/2006 | Cho et al. | 501/69 |
| 2006/0231800 A1 | 10/2006 | Wang et al. | |
| 2006/0231801 A1 | 10/2006 | Carroll et al. | |
| 2006/0231803 A1 | 10/2006 | Wang et al. | |
| 2006/0231804 A1 | 10/2006 | Wang et al. | |
| 2006/0272700 A1 | 12/2006 | Young et al. | |
| 2007/0023388 A1 * | 2/2007 | Nair et al. | 216/13 |
| 2009/0101199 A1 | 4/2009 | Carroll et al. | |

FOREIGN PATENT DOCUMENTS

| | | |
|---|---|---|
| DE | 3446919 A1 | 7/1985 |
| EP | 1713091 A2 | 10/2006 |
| JP | 60-137847 A * | 7/1985 |
| WO | 03/045584 A1 | 6/2003 |

OTHER PUBLICATIONS

International Search Report for International Application No. PCT/US2010/039308 Dated Oct. 4, 2010.

* cited by examiner

*Primary Examiner* — Mark Kopec

(57) ABSTRACT

The invention relates to zinc-containing glass compositions useful in conductive pastes for silicon semiconductor devices and photovoltaic cells.

16 Claims, 1 Drawing Sheet

US 8,262,944 B2

GLASS COMPOSITIONS USED IN CONDUCTORS FOR PHOTOVOLTAIC CELLS

FIELD OF THE INVENTION

Embodiments of the invention relate to a silicon semiconductor device, and a conductive thick film composition containing glass frit for use in a solar cell device.

TECHNICAL BACKGROUND OF THE INVENTION

A conventional solar cell structure with a p-type base has a negative electrode that may be on the front-side (also termed sun-side or illuminated side) of the cell and a positive electrode that may be on the opposite side. Radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metalized, i.e., provided with metal contacts that are electrically conductive.

There is a need for compositions, structures (for example, semiconductor, solar cell or photodiode structures), and semiconductor devices (for example, semiconductor, solar cell or photodiode devices) which have improved electrical performance, and methods of making.

SUMMARY OF THE INVENTION

An embodiment relates to a composition including: (a) electrically conductive material; (b) glass frit, wherein the glass frit includes $SiO_2$, 27-45 wt % ZnO, and 0.5-3 wt % $P_2O_5$; and (c) organic medium. In an aspect, the glass frit includes 35-42 wt % ZnO, and 1-2 wt % $P_2O_5$. In a further aspect, the glass frit includes 8-25 wt % $SiO_2$. The glass frit may also include $Al_2O_3$, PbO, $ZrO_2$, and $PbF_2$. In an aspect, the glass frit may include 8-25 wt % $SiO_2$, 35-42 wt % ZnO, 1-2 wt % $P_2O_5$, 0.1-4 wt % $Al_2O_3$, 8-40 wt % PbO, 0.5-4 wt % $ZrO_2$, and 8-35 wt % $PbF_2$. The electrically conductive material may include one or more of the following: (1) Al, Cu, Au, Ag, Pd and Pt; (2) alloy of Al, Cu, Au, Ag, Pd and Pt; and (3) mixtures thereof. In an embodiment, the electrically conductive material includes Ag. In an aspect, the electrically conductive material is 70-90 wt % of the composition. In an aspect, the glass frit is 3-7 wt % of the composition. In an aspect, the composition may include one or more additives selected from the group consisting of: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof.

An embodiment relates to a method of making a semiconductor device including the steps of: (a) providing a semiconductor substrate, one or more insulating films, and the composition of claim 1; (b) applying the insulating film to the semiconductor substrate; (c) applying the composition to the insulating film on the semiconductor substrate, and (d) firing the semiconductor, insulating film and composition. The insulating film may include one or more components selected from the group consisting of: titanium oxide, silicon nitride, SiNx:H, silicon oxide, and silicon oxide/titanium oxide.

An embodiment relates to a semiconductor device made by the methods described herein. A further embodiment relates to a semiconductor device wherein, prior to firing, the front-side electrode include the compositions described herein. In an aspect, the semiconductor device is a solar cell.

Figure 1A:
FIG. 1 is a process flow diagram illustrating the fabrication of a semiconductor device.
Figure 1B:
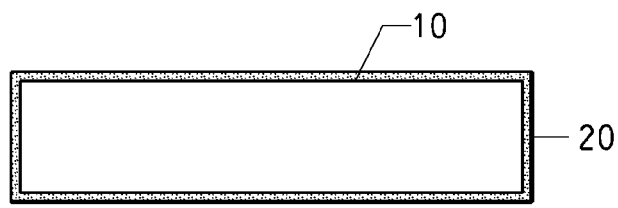
Figure 1C:
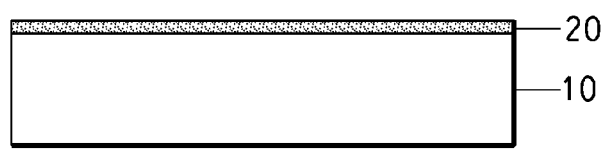
Figure 1D:
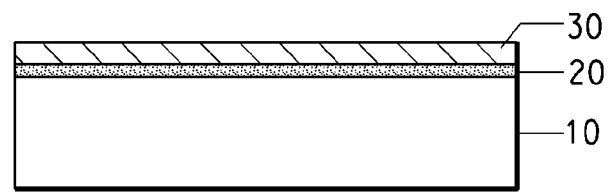
Figure 1E:
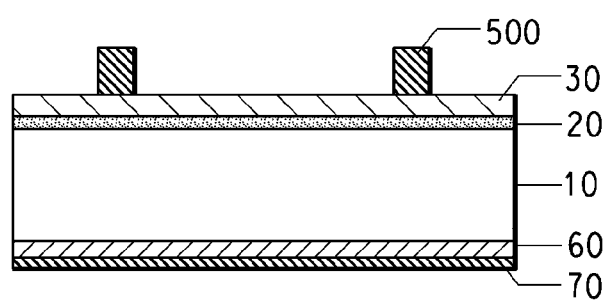
Figure 1F:
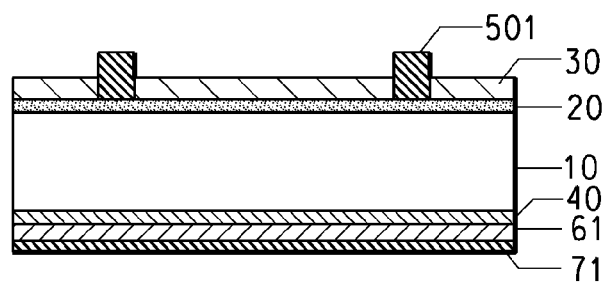

Reference numerals shown in FIG. 1 are explained below.

10: p-type silicon substrate
20: n-type diffusion layer
30: silicon nitride film, titanium oxide film, or silicon oxide film
40: p+ layer (back surface field, BSF)
60: aluminum paste formed on backside
61: aluminum back electrode (obtained by firing back side aluminum paste)
70: silver or silver/aluminum paste formed on backside
71: silver or silver/aluminum back electrode (obtained by firing back side silver paste)
500: silver paste formed on front side according to the invention
501: silver front electrode according to the invention (formed by firing front side silver paste)

DETAILED DESCRIPTION OF THE INVENTION

As used herein, "thick film composition" refers to a composition which, upon firing on a substrate, has a thickness of 1 to 100 microns. The thick film compositions contain a conductive material, a glass composition, and organic vehicle. The thick film composition may include additional components. As used herein, the additional components are termed "additives".

The compositions described herein include one or more electrically functional materials and one or more glass frits dispersed in an organic medium. These compositions may be thick film compositions. The compositions may also include one or more additive(s). Exemplary additives may include metals, metal oxides or any compounds that can generate these metal oxides during firing.

In an embodiment, the electrically functional powders may be conductive powders. In an embodiment, the composition(s), for example conductive compositions, may be used in a semiconductor device. In an aspect of this embodiment, the semiconductor device may be a solar cell or a photodiode. In a further aspect of this embodiment, the semiconductor device may be one of a broad range of semiconductor devices. In an embodiment, the semiconductor device may be a solar cell.

In an embodiment, the thick film compositions described herein may be used in a solar cell. In an aspect of this embodiment, the solar cell efficiency may be greater than 70% of the reference solar cell. In a further embodiment, the solar cell efficiency may be greater than 80% of the reference solar cell. The solar cell efficiency may be greater than 90% of the reference solar cell.

Glass Frits

An aspect of the invention relates to thick film compositions including glass frit compositions. In an embodiment, glass frit compositions (also termed glass compositions) are listed in Table I below.

Glass compositions, also termed glass frits, are described herein as including percentages of certain components (also termed the elemental constituency). Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of skill in the art in glass chemistry, a certain portion of volatile species may be released during the process of making the glass. An example of a volatile species is oxygen.

If starting with a fired glass, one of skill in the art may calculate the percentages of starting components described herein (elemental constituency) using methods known to one of skill in the art including, but not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; Electron microprobe Energy Dispersive Spectroscopy (EDS); Electron microprobe Wavelength Dispersive Spectroscopy (WDS); Cathodoluminescence (CL).

The glass compositions described herein, including those listed in Table I, are not limiting; it is contemplated that one of ordinary skill in the art of glass chemistry could make minor substitutions of additional ingredients and not substantially change the desired properties of the glass composition. For example, substitutions of glass formers such as $P_2O_5$ 0-3, $GeO_2$ 0-3, $V_2O_5$ 0-3 in weight % may be used either individually or in combination to achieve similar performance. For example, one or more intermediate oxides, such as $TiO_2$, $Ta_2O_5$, $Nb_2O_5$, $ZrO_2$, $CeO_2$, and SnO2 may be substituted for other intermediate oxides (i.e., $Al_2O_3$, $CeO_2$, $SnO_2$) present in a glass composition.

An aspect relates to glass frit compositions including one or more fluorine-containing components, including but not limited to: salts of fluorine, fluorides, metal oxyfluoride compounds, and the like. Such fluorine-containing components include, but are not limited to $PbF_2$, $BiF_3$, $AlF_3$, NaF, LiF, KF, CsF, $ZrF_4$, $TiF_4$ and/or $ZnF_2$.

An exemplary method for producing the glass frits described herein is by conventional glass making techniques. Ingredients are weighed then mixed in the desired proportions and heated in a furnace to form a melt in platinum alloy crucibles. One skilled in the art of producing glass frit could employ oxides as raw materials as well as fluoride or oxyfluoride salts. Alternatively, salts, such as nitrate, nitrites, carbonate, or hydrates, which decompose into oxide, fluorides, or oxyfluorides at temperature below the glass melting temperature can be used as raw materials. As well known in the art, heating is conducted to a peak temperature (800° C.-1400° C.) and for a time such that the melt becomes entirely liquid, homogeneous, and free of any residual decomposition products of the raw materials. The molten glass is then quenched between counter rotating stainless steel rollers to form a 10-15 mil thick platelet of glass. The resulting glass platelet was then milled to form a powder with its 50% volume distribution set between to a desired target (e.g. 0.8-1.5 µm). One skilled in the art of producing glass frit may employ alternative synthesis techniques such as but not limited to water quenching, sol-gel, spray pyrolysis, or others appropriate for making powder forms of glass.

The glass compositions used herein, in weight percent total glass composition, are shown in Table 1. Unless stated otherwise, as used herein, wt % in reference to glass frit components means wt % of glass composition only. In another embodiment, glass frits compositions described herein may include one or more of $SiO_2$, $Al_2O_3$, PbO, $ZrO_2$, ZnO, $Na_2O$, $Li_2O$, $P_2O_5$, or $PbF_2$. In aspects of this embodiment, the:

$SiO_2$ may be 5 to 28 wt %, 8 to 25 wt %, or 10 to 22 wt %,
$Al_2O_3$ may be 0.1 to 5 wt %, 0.1 to 4 wt %, or 2 to 3 wt %,
PbO may be 0.1 to 65 wt %, 8 to 40 wt %, or 10 to 30 wt %,
$ZrO_2$ may be 0.1 to 5 wt %, 0.5 to 4 wt %, or 1 to 2 wt %,
ZnO may be 25 to 50 wt %, 27 to 45 wt %, or 35 to 42 wt %,
$Na_2O$ may be 0 to 2 wt %, 0.1 to 1 wt %, or 0.2 to 0.7 wt %,
$Li_2O$ may be 0 to 2 wt %, 0.1 to 1 wt %, or 0.1 to 0.8 wt %,
$P_2O_5$ may be 0.1 to 10 wt %, 0.5 to 3 wt %, or 1 to 2 wt %, or
$PbF_2$ may be 1 to 50 wt %, 8 to 45 wt %, or 20 to 35 wt % based on the wt % of the glass components.

One skilled the art of making glass could replace some or all of the $Na_2O$ or $Li_2O$ with NaF, LiF, $K_2O$, KF, $Cs_2O$, CsF, RbF or $Rb_2O$ and create a glass with properties similar to the compositions listed above where this embodiment the total alkali metal oxide content may be 0 to 2 wt %, 0 to 1 wt %, or 0.1 to 1 wt %. The glass compositions can be described alternatively in wt % of the elements of the glass composition. In one embodiment the glass may include, in part:

fluorine 0.1 to 10 elemental wt %, 2 to 7 elemental wt %, or 3 to 5 elemental wt %, or
lead 35 to 85 elemental wt %, 45 to 75 elemental wt %, or 60 to 70 elemental wt %, or
zinc 5 to 45 elemental wt %, 10 to 30 elemental wt %, or 15 to 20 elemental wt %.

In a further embodiment, the glass frit composition(s) herein may include one or more of a third set of components: $CeO_2$, $SnO_2$, $Ga_2O_3$, $In_2O_3$, NiO, $MoO_3$, $WO_3$, $Y_2O_3$, $La_2O_3$, $Nd_2O_3$, FeO, $HfO_2$, $Cr_2O_3$, CdO, $Nb_2O_5$, $Ag_2O$, $Sb_2O_3$, and metal halides (e.g. NaCl, KBr, NaI).

One of skill in the art would recognize that the choice of raw materials could unintentionally include impurities that may be incorporated into the glass during processing. For example, the impurities may be present in the range of hundreds to thousands ppm.

The presence of the impurities would not alter the properties of the glass, the thick film composition, or the fired device. For example, a solar cell containing the thick film composition may have the efficiency described herein, even if the thick film composition includes impurities.

In a further aspect of this embodiment, thick film composition may include electrically functional powders and glass-ceramic frits dispersed in an organic medium. In an embodiment, these thick film conductor composition(s) may be used in a semiconductor device. In an aspect of this embodiment, the semiconductor device may be a solar cell or a photodiode.

The amount of glass frit in the total thick film composition is in the range of 1-8 wt % of the total composition. In one embodiment, the glass composition is present in the amount of 3-7 wt % of the total thick film composition. In a further embodiment, the glass composition is present in the range of 3.5-6.5 wt % of the total thick film composition.

Conductive Materials

In an embodiment, the thick film composition may include a functional phase that imparts appropriate electrically functional properties to the composition. In an embodiment, the electrically functional powder may be a conductive powder. In an embodiment the electrically functional phase may include conductive materials (also termed conductive particles, herein). The conductive particles may include conductive powders, conductive flakes, or a mixture thereof, for example.

In an embodiment, the conductive particles may include Ag. In a further embodiment, the conductive particles may include silver (Ag) and aluminum (Al). In a further embodiment, the conductive particles may, for example, include one or more of the following: Cu, Au, Ag, Pd, Pt, Al, Ag—Pd, Pt—Au, etc. In an embodiment, the conductive particles may include one or more of the following: (1) Al, Cu, Au, Ag, Pd and Pt; (2) alloy of Al, Cu, Au, Ag, Pd and Pt; and (3) mixtures thereof.

In an embodiment, the functional phase of the composition may be coated or uncoated silver particles which are electrically conductive. In an embodiment in which the silver particles are coated, they are at least partially coated with a surfactant. In an embodiment, the surfactant may include one or more of the following non-limiting surfactants: stearic acid, palmitic acid, a salt of stearate, a salt of palmitate, lauric acid, palmitic acid, oleic acid, stearic acid, capric acid, myristic acid and linoleic acid, and mixtures thereof. The counter ion may be, but is not limited to, hydrogen, ammonium, sodium, potassium and mixtures thereof.

The particle size of the silver is not subject to any particular limitation. In an embodiment, the average particle size may be less than 10 microns, and, in a further embodiment, no more than 5 microns. In an aspect, the average particle size may be 0.1 to 5 microns, for example.

In an embodiment, the silver may be 60 to 93 wt % of the paste composition. In a further embodiment, the silver may be 70 to 90 wt % of the paste composition. In a further embodiment, the silver may be 75 to 86 wt % of the paste composition.

In an embodiment, the silver may be 90 to 99 wt % of the solids in the composition (i.e., excluding the organic vehicle). In a further embodiment, the silver may be 92 to 97 wt % of the solids in the composition. In a further embodiment, the silver may be 93 to 95 wt % of the solids in the composition.

As used herein, "particle size" is intended to mean "average particle size"; "average particle size" means the 50% volume distribution size. Volume distribution size may be determined by a number of methods understood by one of skill in the art, including but not limited to LASER diffraction and dispersion method using a Microtrac particle size analyzer.

Additives

In an embodiment, the thick film composition may include an additive. In an embodiment, the additive may be selected from one or more of the following: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof.

In an embodiment, the additive may include a Zn-containing additive. The Zn-containing additive may include one or more of the following: (a) Zn, (b) metal oxides of Zn, (c) any compounds that can generate metal oxides of Zn upon firing, and (d) mixtures thereof. In an embodiment, the Zn-containing additive may include Zn resinate.

In an embodiment, the Zn-containing additive may include ZnO. The ZnO may have an average particle size in the range of 1 nanometer to 10 microns. In a further embodiment, the ZnO may have an average particle size of 40 nanometers to 5 microns. In a further embodiment, the ZnO may have an average particle size of 60 nanometers to 3 microns. In a further embodiment the ZnO may have an average particle size of less than 100 nm; less than 90 nm; less than 80 nm; 1 nm to less than 100 nm; 1 nm to 95 nm; 1 nm to 90 nm; 1 nm to 80 nm; 7 nm to 30 nm; 1 nm to 7 nm; 35 nm to 90 nm; 35 nm to 80 nm, 65 nm to 90 nm, 60 nm to 80 nm, and ranges in between, for example.

In an embodiment, ZnO may be present in the composition in the range of 0-7 wt % total thick film composition. In an embodiment, the ZnO may be present in the range of 0-3 wt % total thick film composition. In a further embodiment, the ZnO may be present in the range of 4-6.5 wt % total thick film composition.

In a further embodiment the Zn-containing additive (for example Zn, Zn resinate, etc.) may be present in the total thick film composition in the range of 2-16 wt %. In a further embodiment the Zn-containing additive may be present in the range 3-14 wt % total thick film composition. In a further embodiment, the Zn-containing additive may be present in the range of 4-12 wt % of the total thick film composition.

In one embodiment, the particle size of the metal/metal oxide additive (such as Zn, for example) may be in the range of 7 nanometers (nm) to 125 nm; in a further embodiment, the particle size may be less than 100 nm, 90 nm, 85 nm, 80 nm, 75 nm, 70 nm, 65 nm, or 60 nm, for example.

Organic Medium

In an embodiment, the thick film compositions described herein may include organic medium. The inorganic components may be mixed with an organic medium, for example, by mechanical mixing to form pastes. A wide variety of inert viscous materials can be used as organic medium. In an embodiment, the organic medium may be one in which the inorganic components are dispersible with an adequate degree of stability. In an embodiment, the rheological properties of the medium may lend certain application properties to the composition, including: stable dispersion of solids, appropriate viscosity and thixotropy for screen printing, appropriate wettability of the substrate and the paste solids, a good drying rate, and good firing properties. In an embodiment, the organic vehicle used in the thick film composition may be a nonaqueous inert liquid. The use of various organic vehicles, which may or may not contain thickeners, stabilizers and/or other common additives, is contemplated. The organic medium may be a solution of polymer(s) in solvent(s). In an embodiment, the organic medium may also include one or more components, such as surfactants. In an embodiment, the polymer may be ethyl cellulose. Other exemplary polymers include ethylhydroxyethyl cellulose, wood rosin, mixtures of ethyl cellulose and phenolic resins, polymethacrylates of lower alcohols, and monobutyl ether of ethylene glycol monoacetate, or mixtures thereof. In an embodiment, the solvents useful in thick film compositions described herein include ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In a further embodiment, the organic medium may include volatile liquids for promoting rapid hardening after application on the substrate.

In an embodiment, the polymer may be present in the organic medium in the range of 8 wt. % to 11 wt. % of the total composition, for example. The thick film silver composition may be adjusted to a predetermined, screen-printable viscosity with the organic medium.

In an embodiment, the ratio of organic medium in the thick film composition to the inorganic components in the dispersion may be dependent on the method of applying the paste and the kind of organic medium used, as determined by one of skill in the art. In an embodiment, the dispersion may include 70-95 wt % of inorganic components and 5-30 wt % of organic medium (vehicle) in order to obtain good wetting.

Fired Thick Film Compositions

In an embodiment, the organic medium may be removed during the drying and firing of the semiconductor device. In an aspect, the glass frit, Ag, and additives may be sintered during firing to form an electrode. The fired electrode may include components, compositions, and the like, resulting from the firing and sintering process. For example, in an embodiment, the fired electrode may include zinc-silicates, including but not limited to willemite ($Zn_2SiO_4$) and $Zn_{1.7}SiO_{4-x}$ (in an embodiment, x may be 0-1).

In an aspect of this embodiment, the semiconductor device may be a solar cell or a photodiode.

Method of Making a Semiconductor Device

An embodiment relates to methods of making a semiconductor device. In an embodiment, the semiconductor device may be used in a solar cell device. The semiconductor device may include a front-side electrode, wherein, prior to firing, the front-side (illuminated-side) electrode may include composition(s) described herein.

In an embodiment, the method of making a semiconductor device includes the steps of: (a) providing a semiconductor substrate; (b) applying an insulating film to the semiconductor substrate; (c) applying a composition described herein to the insulating film; and (d) firing the device.

Exemplary semiconductor substrates useful in the methods and devices described herein are recognized by one of skill in the art, and include, but are not limited to: single-crystal silicon, multicrystalline silicon, ribbon silicon, and the like. The semiconductor substrate may be junction bearing. The semiconductor substrate may be doped with phosphorus and boron to form a p/n junction. Methods of doping semiconductor substrates are understood by one of skill in the art.

The semiconductor substrates may vary in size (length× width) and thickness, as recognized by one of skill in the art. In a non-limiting example, the thickness of the semiconductor substrate may be 50 to 500 microns; 100 to 300 microns; or 140 to 200 microns. In a non-limiting example, the length and width of the semiconductor substrate may both equally be 100 to 250 mm; 125 to 200 mm; or 125 to 156 mm.

Exemplary insulating films useful in the methods and devices described herein are recognized by one of skill in the art, and include, but are not limited to: silicon nitride, silicon oxide, titanium oxide, $SiN_x$:H, hydrogenated amorphous silicon nitride, and silicon oxide/titanium oxide film. The insulating film may be formed by PECVD, CVD, and/or other techniques known to one of skill in the art. In an embodiment in which the insulating film is silicon nitride, the silicon nitride film may be formed by a plasma enhanced chemical vapor deposition (PECVD), thermal CVD process, or physical vapor deposition (PVD). In an embodiment in which the insulating film is silicon oxide, the silicon oxide film may be formed by thermal oxidation, thermal CVD, plasma CVD, or PVD. The insulating film (or layer) may also be termed the anti-reflective coating (ARC).

Compositions described herein may be applied to the ARC-coated semiconductor substrate by a variety of methods known to one of skill in the art, including, but not limited to, screen-printing, ink-jet, co-extrusion, syringe dispense, direct writing, and aerosol ink jet. The composition may be applied in a pattern. The composition may be applied in a predetermined shape and at a predetermined position. In an embodiment, the composition may be used to form both the conductive fingers and busbars of the front-side electrode. In an embodiment, the width of the lines of the conductive fingers may be 20 to 200 microns; 40 to 150 microns; or 60 to 100 microns. In an embodiment, the thickness of the lines of the conductive fingers may be 5 to 50 microns; 10 to 35 microns; or 15 to 30 microns.

In a further embodiment, the composition may be used to form the conductive, Si contacting fingers.

The composition coated on the ARC-coated semiconductor substrate may be dried as recognized by one of skill in the art, for example, for 0.5 to 10 minutes, and then fired. In an embodiment, volatile solvents and organics may be removed during the drying process. Firing conditions will be recognized by one of skill in the art. In exemplary, non-limiting, firing conditions the silicon wafer substrate is heated to maximum temperature of between 600° C. and 900° C. for a duration of 1 second to 2 minutes. In an embodiment, the maximum silicon wafer temperature reached during firing ranges from 650° C. to 800° C. for a duration of 1 to 10 seconds. In a further embodiment, the electrode formed from the conductive thick film composition(s) may be fired in an atmosphere composed of a mixed gas of oxygen and nitrogen. This firing process removes the organic medium and sinters the glass frit with the Ag powder in the conductive thick film composition. In a further embodiment, the electrode formed from the conductive thick film composition(s) may be fired above the organic medium removal temperature in an inert atmosphere not containing oxygen. This firing process sinters or melts base metal conductive materials such as copper in the thick film composition.

In an embodiment, during firing, the fired electrode (preferably the fingers) may react with and penetrate the insulating film, forming electrical contact with the silicon substrate.

In a further embodiment, prior to firing, other conductive and device enhancing materials are applied to the opposite type region of the semiconductor device and co-fired or sequentially fired with the compositions described herein. The opposite type region of the device is on the opposite side of the device. The materials serve as electrical contacts, passivating layers, and solderable tabbing areas.

In an embodiment, the opposite type region may be on the non-illuminated (back) side of the device. In an aspect of this embodiment, the back-side conductive material may contain aluminum. Exemplary back-side aluminum-containing compositions and methods of applying are described, for example, in US 2006/0272700, which is hereby incorporated herein by reference.

In a further aspect, the solderable tabbing material may contain aluminum and silver. Exemplary tabbing compositions containing aluminum and silver are described, for example in US 2006/0231803, which is hereby incorporated herein by reference.

In a further embodiment the materials applied to the opposite type region of the device are adjacent to the materials described herein due to the p and n region being formed side by side. Such devices place all metal contact materials on the non illuminated (back) side of the device to maximize incident light on the illuminated (front) side.

The semiconductor device may be manufactured by the following method from a structural element composed of a junction-bearing semiconductor substrate and a silicon nitride insulating film formed on a main surface thereof. The method of manufacture of a semiconductor device includes the steps of applying (such as coating and printing) onto the insulating film, in a predetermined shape and at a predetermined position, the conductive thick film composition having the ability to penetrate the insulating film, then firing so that the conductive thick film composition melts and passes through the insulating film, effecting electrical contact with the silicon substrate. The electrically conductive thick film composition is a thick-film paste composition, as described herein, which is made of a silver powder, Zn-containing additive, a glass or glass powder mixture having a softening point of 300° C. to 600° C., dispersed in an organic vehicle and optionally, additional metal/metal oxide additive(s).

An embodiment of the invention relates to a semiconductor device manufactured from the methods described herein. Devices containing the compositions described herein may contain zinc-silicates, as described above.

An embodiment of the invention relates to a semiconductor device manufactured from the method described above.

Additional substrates, devices, methods of manufacture, and the like, which may be utilized with the thick film compositions described herein are described in US patent application publication numbers US 2006/0231801, US 2006/0231804, and US 2006/0231800, which are hereby incorporated herein by reference in their entireties.

EXAMPLES

Glass Property Measurement

Glasses in Table I, and comparative glasses in Table II were prepared as described herein, using techniques recognized by one of skill in the art. For reference, Table III describes glasses from TAKAMORI, T. (1979) Solder glasses. In Treatise on materials science and technology, Vol. 17 Glass II. Eds: TOMOZAMA and DOREMUS, Academic Press. As shown in Table IV, properties including density, Tg, Ts, and Tx were measured for glasses 1, 2, 3, 4, 5, 6, 7, 8, 9, 10, 11, and 12 from Tables I and II. Glass properties of Table III glasses A-E from TAKAMORI, T. (1979) Solder glasses. In Treatise on materials science and technology, Vol. 17 Glass II. Eds: TOMOZAMA and DOREMUS, Academic Press. Note that glasses A-E were not made in the context of the present application; the glasses and properties as described in Takamori are provided herein for comparison.

Paste Preparation

Paste preparations, in general, were prepared using the following procedure: Separate pastes were made containing organic medium and glass frit or Ag powder. The appropriate amount of solvent, medium and surfactant were weighed and mixed with glass frit or silver powder by a THINKY planetary centrifugal mixer for 20 seconds. Then, glass contained paste and silver contained paste were blended in certain amount of rate to gain desired composition. This was mixed by a THINKY planetary centrifugal mixer for 20 seconds. When well mixed, the paste was repeatedly passed through a 3-roll mill at 0-300 psi pressure. The degree of dispersion was controlled by the $4^{th}$ scratch fineness of grind (FOG). A typical FOG value for a paste is less than 20 microns for the fourth longest, continuous scratch and less than 10 microns for the point at which 50% of the paste is scratched.

The paste examples of Tables V and VI were made using the procedure described above for making the paste compositions listed in the table according to the following details. The frit types described in Table V refer the glass compositions in Table I, and the comparative frit types in Table VI refer to the glass compositions in Table II. Tested pastes contained 75 to 86% silver powder. Silver type I was spherical Ag powder with a narrow particle size distribution with a D50=1-3 μm. Silver type II was a 50/50 by weight blend of two silver powders; one Ag powder in the blend had a surface area of <1 $m^2$/gm and tap density of 3-5 g/cc, the other Ag powder in the blend was spherical with a narrow size distribution with a D50=2-4 μm. Silver type III was a 84.2%-15.8% blend of two silver powders; one Ag powder in the blend had a surface area of <1 $m^2$/gm and tap density of 3-5 g/cc, the other Ag powder in the blend had a surface area of 1.8-2.4 $m^2$/gm and tap density of 1.5-2.1 g/cc with a D50=0.8-3 μm. Pastes were applied to 1.5"×1.5" cut cells, and efficiency and fill factor were measured for each sample.

Pastes were applied by screen printing using a Price MS series printer set with a squeegee speed of 100 mm/sec at 10 psi pressure. The screen used had a pattern of 18 finger lines with a 80-110 μm opening and 1 bus bar with a 2 mm opening on a 20 μm emulsion in a screen with 250 mesh and 28 μm wires. The substrates used were 1.5 inch square sections cut by laser scribing full Si solar cell multi crystalline cells, acid textured, 65Ω/☐ emitter, coated with PECVD $SiN_x$:H ARC wafers. A commercially available Al paste, DuPont PV381, was printed on the non-illuminated (back) side of the device. The device with the printed patterns on both sides was then dried for 5 minutes in a drying oven with a 150° C. peak temperature. The substrates were then fired sun-side up with a Despatch LCD72xx 6 zone IR furnace using a 5500 mm/min belt speed and 550-600-650-700-800-885° C. temperature set points. The actual temperature of the part was measured during processing. The measured peak temperature of each part was 715° C. and each part was above 650° C. for a total time of 4 seconds. The fully processed samples were then tested for PV performance using a calibrated NPC NCT-M-150AA tester.

An exception to the above procedure was used on glass sample #6 in that PECVD $SiN_x$:H ARC was not applied to the front side of the test parts; the conductor paste was printed directly to the front side of the wafer.

Test Procedure—Efficiency

The solar cells built according to the method described herein were tested for conversion efficiency. An exemplary method of testing efficiency is provided below.

In an embodiment, the solar cells built according to the method described herein were placed in a commercial I-V tester for measuring efficiencies (NPC NCT-M-150AA). The Xe Arc lamp in the I-V tester simulated the sunlight with a known intensity and irradiated the front surface of the cell. The tester used a multi-point contact method to measure current (I) and voltage (V) under AM 1.5 illumination at 25° C. settings to determine the cell's I-V curve. Both fill factor (FF) and efficiency (Eff) were calculated from the I-V curve.

Paste efficiency and fill factor values were normalized to corresponding values obtained with cells contacted with industry standards. The average efficiency and fill factor are shown in Tables V and VI.

The above efficiency test is exemplary. Other equipment and procedures for testing efficiencies will be recognized by one of ordinary skill in the art.

TABLE I glass compositions

| frit ID # | SiO2 | Al2O3 | PbO | ZrO2 | ZnO | Na2O | P2O5 | Li2O | PbF2 |
|---|---|---|---|---|---|---|---|---|---|
| 1 | 21.90 | 2.65 | 23.96 | 1.93 | 35.17 | | 1.48 | | 12.91 |
| 2 | 13.12 | 2.56 | 26.62 | 1.86 | 40.83 | 0.47 | 1.42 | 0.22 | 12.91 |
| 3 | 10.85 | 2.30 | 22.62 | 1.67 | 36.75 | | 1.28 | | 24.52 |
| 4 | 18.07 | 2.62 | 13.70 | 1.90 | 37.02 | 0.48 | 1.46 | 0.23 | 24.52 |
| 5 | 14.99 | 2.59 | 13.33 | 1.88 | 40.54 | 0.47 | 1.44 | 0.23 | 24.52 |

TABLE II comparative glass compositions

| frit ID # | SiO2 | Al2O3 | PbO | ZrO2 | ZnO | BaO | TiO2 | SnO2 | Na2O | P2O5 | B2O3 | Li2O | PbF2 | ZnF2 |
|---|---|---|---|---|---|---|---|---|---|---|---|---|---|---|
| 6 | 8.77 | 0.51 | 29.11 | | 44.56 | 0.89 | 1.02 | | | | 15.13 | | | |
| 7 | 21.69 | 2.63 | 13.81 | 1.91 | 28.12 | | 7.32 | | 24.52 | | | | | |
| 8 | 22.29 | 2.70 | 19.13 | 1.96 | 26.31 | | | 0.49 | 7.52 | | | 0.24 | 19.36 | |
| 9 | 21.52 | 2.61 | | 1.89 | 25.89 | | | | 7.26 | | | | 37.64 | 3.17 |
| 10 | 22.01 | 2.67 | 14.31 | 1.93 | 29.38 | | | 0.49 | 4.46 | | | 0.23 | 24.52 | |
| 11 | 22.21 | 2.69 | 24.45 | 1.95 | 30.93 | | | 0.25 | 4.50 | | | 0.12 | 12.91 | |
| 12 | 22.52 | 2.73 | 24.95 | 1.98 | 26.58 | | | 0.50 | 7.60 | | | 0.24 | 12.91 | |

TABLE III

Glasses from TAKAMORI, T. (1979) Solder glasses. In Treatise on materials science and technology, Vol. 17 Glass II. Eds: TOMOZAMA and DOREMUS, Academic Press.

| Frit ID | SiO2 | Al2O3 | PbO | ZnO | B2O3 | Bi2O3 | Ta2O5 | CeO2 | CuO |
|---|---|---|---|---|---|---|---|---|---|
| A | 19 | | 17 | 50 | 14 | | | | |
| B | 15 | | 5 | 60 | 18 | | | | 2 |
| C | 13 | | 5 | 57 | 20 | | 5 | | |
| D | 13 | | 2 | 57 | 20 | 1 | 5 | 2 | |
| E | 10 | 2 | 4.5 | 57 | 20 | | 3 | 3.5 | |

TABLE IV

Glass property data

| Frit ID | Density (g/cc) | Tg (°C.) | Ts (°C.) | Tx (°C.) |
|---|---|---|---|---|
| A | | | 620♦ | |
| B | | | 630♦ | |
| C | | | 690♦ | |
| D | | | 700♦ | |
| E | | | 700♦ | |
| 6 | 4.61 | 553* | 564☉ | 609 |
| 8 | 4.46 | 472† | 500† | 612 |
| 9 | 4.64 | 532☉ | 548☉ | |
| 10 | 4.67 | 466† | 515† | 584 |
| 11 | 4.69 | 483† | ND† | 605 |
| 12 | 4.51 | 457† | 541† | 638 |
| 7 | 4.61 | 460† | 546† | 651 |
| 1 | 4.85 | 507† | ND† | 576 |
| 2 | 5.33 | 513† | ND† | 553 |
| 3 | 5.63 | 445† | 463† | 487 |
| 4 | 5.01 | 390† | ND† | 422 |
| 5 | 4.83 | 416† | 494† | 508 |

Tg and Ts from DTA†, TMA☉, or dilatometry♦ Tx from DTA
ND = not detectable
*estimated from parallel plate viscosity data

TABLE V

Efficiency and Fill Factor

| Frit ID | wt % frit powder | wt % ZnO powder | Ag type | wt % Ag powder | Avg Eff % | Avg FF | Avg Rs | total wt % ZnO in paste (frit & additive) |
|---|---|---|---|---|---|---|---|---|
| 5 | 4.05 | 0 | II | 85.96 | 15.61 | 74.26% | 0.118 | 1.64 |
| 3 | 6.58 | 0 | I | 75.36 | 15.34 | 74.71% | 0.110 | 2.42 |
| 4 | 5.90 | 0 | I | 75.90 | 15.07 | 75.94% | 0.108 | 2.18 |
| 2 | 6.25 | 0 | I | 75.62 | 14.80 | 74.57% | 0.123 | 2.55 |

TABLE VI

Comparative Efficiency and Fill factor

| Frit ID | wt % frit powder | ZnO powder | Ag type | wt % Ag powder | Avg Eff % | Avg FF | Avg Rs | total wt % ZnO in paste (frit & additive) |
|---|---|---|---|---|---|---|---|---|
| 6 | 3.91 | 0 | III | 79.6 | 3.14 | 27.60% | — | 1.74 |
| 7 | 5.45 | 0 | I | 76.26 | 6.65 | 34.32% | 0.925 | 1.53 |
| 12 | 5.34 | 0 | I | 76.35 | 6.01 | 33.53% | 1.069 | 1.42 |
| 11 | 5.54 | 0 | I | 76.19 | 5.44 | 31.99% | 1.626 | 1.71 |
| 10 | 5.52 | 0 | I | 76.21 | 6.48 | 39.87% | 3.560 | 1.62 |

What is claimed is:

1. A composition comprising:
   (a) electrically conductive material;
   (b) glass frit, wherein the glass frit comprises $SiO_2$, $Al_2O_3$, PbO, $ZrO_2$, $PbF_2$, ZnO, and $P_2O_5$; and
   (c) organic medium.

2. A composition comprising:
   (a) electrically conductive material;
   (b) glass frit, wherein the glass frit comprises $SiO_2$, $Al_2O_3$, PbO, $ZrO_2$, $PbF_2$, 27-45 wt % ZnO, and 0.5-3 wt % $P_2O_5$; and
   (c) organic medium.

3. The composition of claim 2, wherein the glass frit comprises 35-42 wt % ZnO, and 1-2 wt % $P_2O_5$.

4. The composition of claim 2, wherein the glass frit comprises 8-25 wt % $SiO_2$.

5. The composition of claim 4, wherein the glass frit comprises 8-25 wt % $SiO_2$, 35-42 wt % ZnO, 1-2 wt % $P_2O_5$, 0.1-4 wt % $Al_2O_3$, 8-40 wt % PbO, 0.5-4 wt % $ZrO_2$, and 8-35 wt % $PbF_2$.

6. The composition of claim 2, wherein the electrically conductive material comprises one or more of the following: (1) Al, Cu, Au, Ag, Pd and Pt; (2) alloy of Al, Cu, Au, Ag, Pd and Pt; and (3) mixtures thereof.

7. The composition of claim 2, wherein the electrically conductive material comprises Ag.

8. The composition of claim 2, wherein the electrically conductive material is 70-90 wt % of the composition.

9. The composition of claim 2, wherein the glass frit is 3-7 wt % of the composition.

10. The composition of claim 1 further comprising one or more additives selected from the group consisting of: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof.

11. A method of making a semiconductor device including the steps of:
    (a) providing a semiconductor substrate, one or more insulating films, and the composition of claim 2;
    (b) applying the insulating film to the semiconductor substrate;
    (c) applying the composition to the insulating film on the semiconductor substrate, and
    (d) firing the semiconductor, insulating film and composition.

12. The method of claim 11 wherein the insulating film includes one or more components selected from the group consisting of: titanium oxide, silicon nitride, $SiN_x$:H, silicon oxide, and silicon oxide/titanium oxide.

13. A semiconductor device made by the method of claim 11.

14. The semiconductor device of claim 13, wherein the semiconductor device is a solar cell.

15. A semiconductor device wherein, prior to firing, the front-side electrode comprises the composition of claim 2.

16. The semiconductor device of claim 15, wherein the semiconductor device is a solar cell.

* * * * *